United States Patent
Maruyama et al.

(10) Patent No.: US 7,176,509 B2
(45) Date of Patent: Feb. 13, 2007

(54) SEMICONDUCTOR DEVICE AND METHOD FOR MANUFACTURING THE SAME

(75) Inventors: Kenji Maruyama, Kawasaki (JP); Jeffrey Scott Cross, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 147 days.

(21) Appl. No.: 10/902,082

(22) Filed: Jul. 30, 2004

(65) Prior Publication Data

US 2005/0214954 A1 Sep. 29, 2005

(30) Foreign Application Priority Data

Mar. 25, 2004 (JP) .............................. 2004-089338

(51) Int. Cl.
- H01L 29/76 (2006.01)
- H01L 29/94 (2006.01)
- H01L 31/00 (2006.01)

(52) U.S. Cl. ............... 257/295; 257/296; 257/E27.104; 257/E21.664

(58) Field of Classification Search ........ 257/295–306, 257/213, 532, E27.104
See application file for complete search history.

(56) References Cited

U.S. PATENT DOCUMENTS

| | | | |
|---|---|---|---|
| 5,155,573 A * | 10/1992 | Abe et al. ................... | 257/304 |
| 6,198,119 B1 * | 3/2001 | Nabatame et al. .......... | 257/295 |
| 6,300,652 B1 * | 10/2001 | Risch et al. ................ | 257/296 |
| 6,936,880 B2 * | 8/2005 | Park ........................... | 257/306 |
| 6,943,080 B2 * | 9/2005 | Maruyama .................. | 438/239 |
| 6,974,985 B2 * | 12/2005 | Kurasawa et al. .......... | 257/296 |
| 7,041,551 B2 * | 5/2006 | Zhuang et al. .............. | 438/239 |

FOREIGN PATENT DOCUMENTS

| JP | 06021338 | 1/1994 |
|---|---|---|
| JP | 09245525 | 9/1997 |

* cited by examiner

Primary Examiner—B. William Baumeister
Assistant Examiner—Igwe U. Anya
(74) Attorney, Agent, or Firm—Westerman, Hattori, Daniels & Adrian, LLP.

(57) ABSTRACT

Two ferroelectric capacitors including a PZT film are connected to one MOS transistor. Electrodes of the ferroelectric capacitor are arranged above a main plane of a substrate parallel to the main plane. Therefore, high capacity can be obtained easily. Furthermore, a (001) direction of the PZT film is parallel to the virtual straight line linking between the two electrodes. Therefore, a direction in which an electric field is applied coincides with a direction of a polarization axis, so that high electric charge amount of remanent polarization can be obtained.

5 Claims, 12 Drawing Sheets

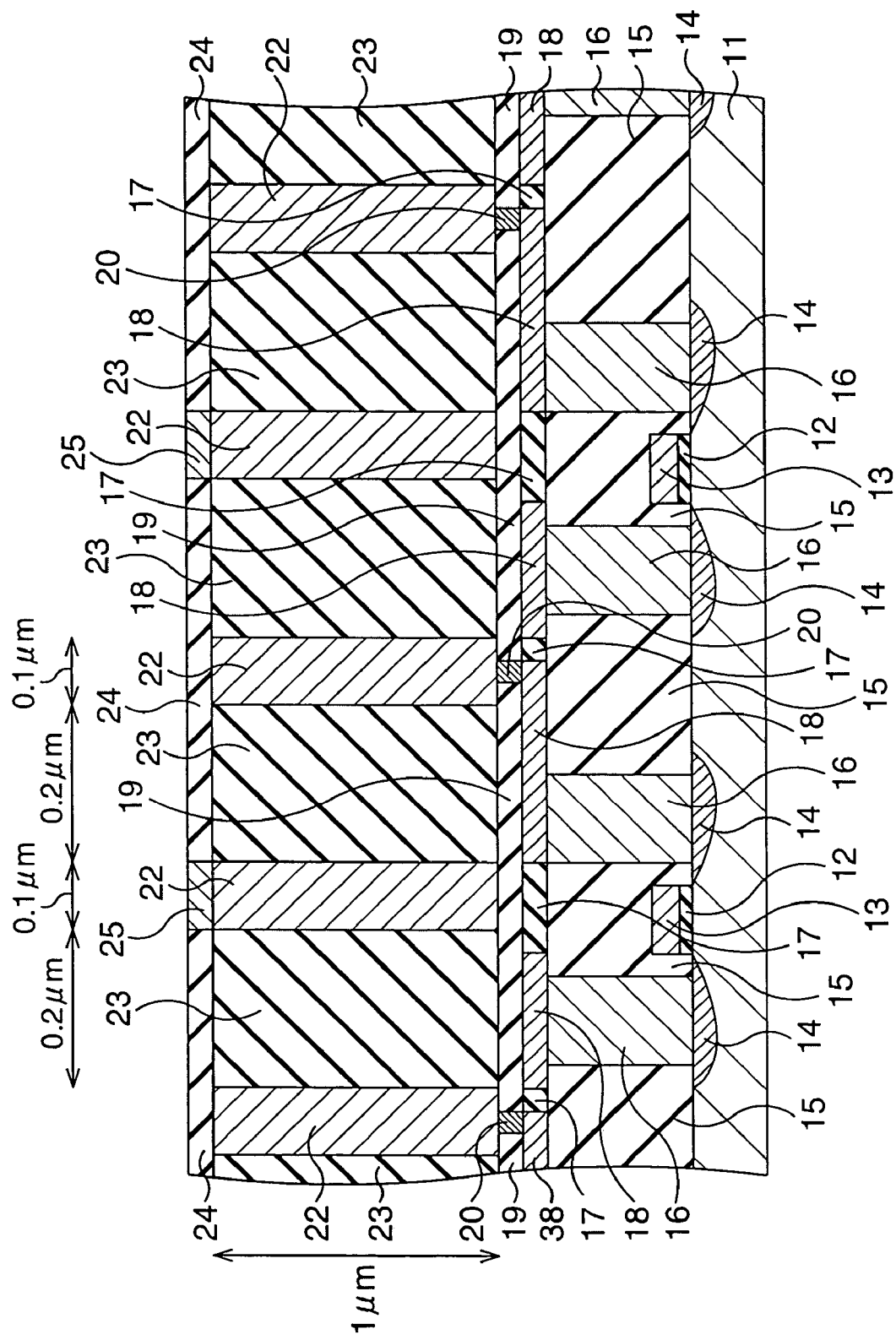

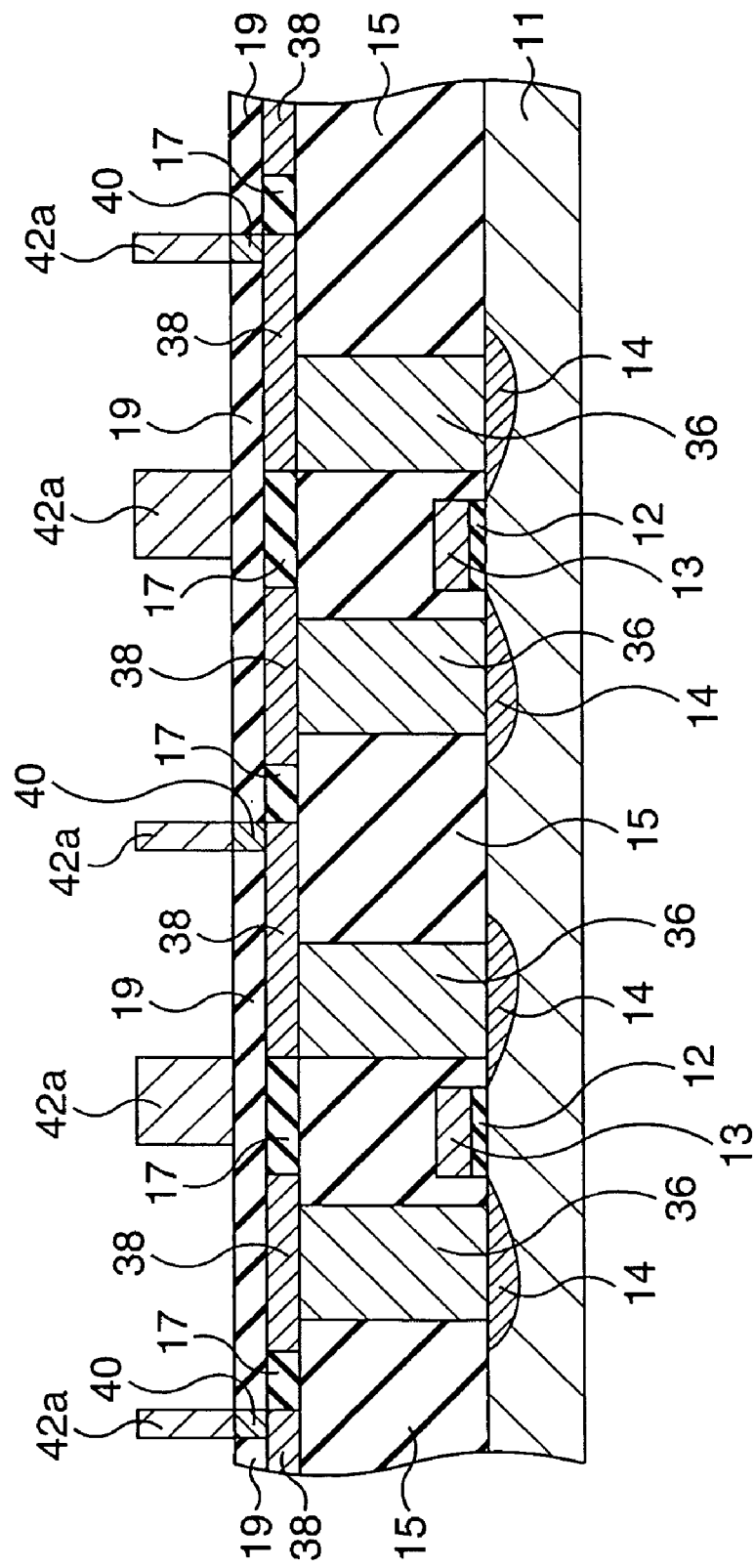

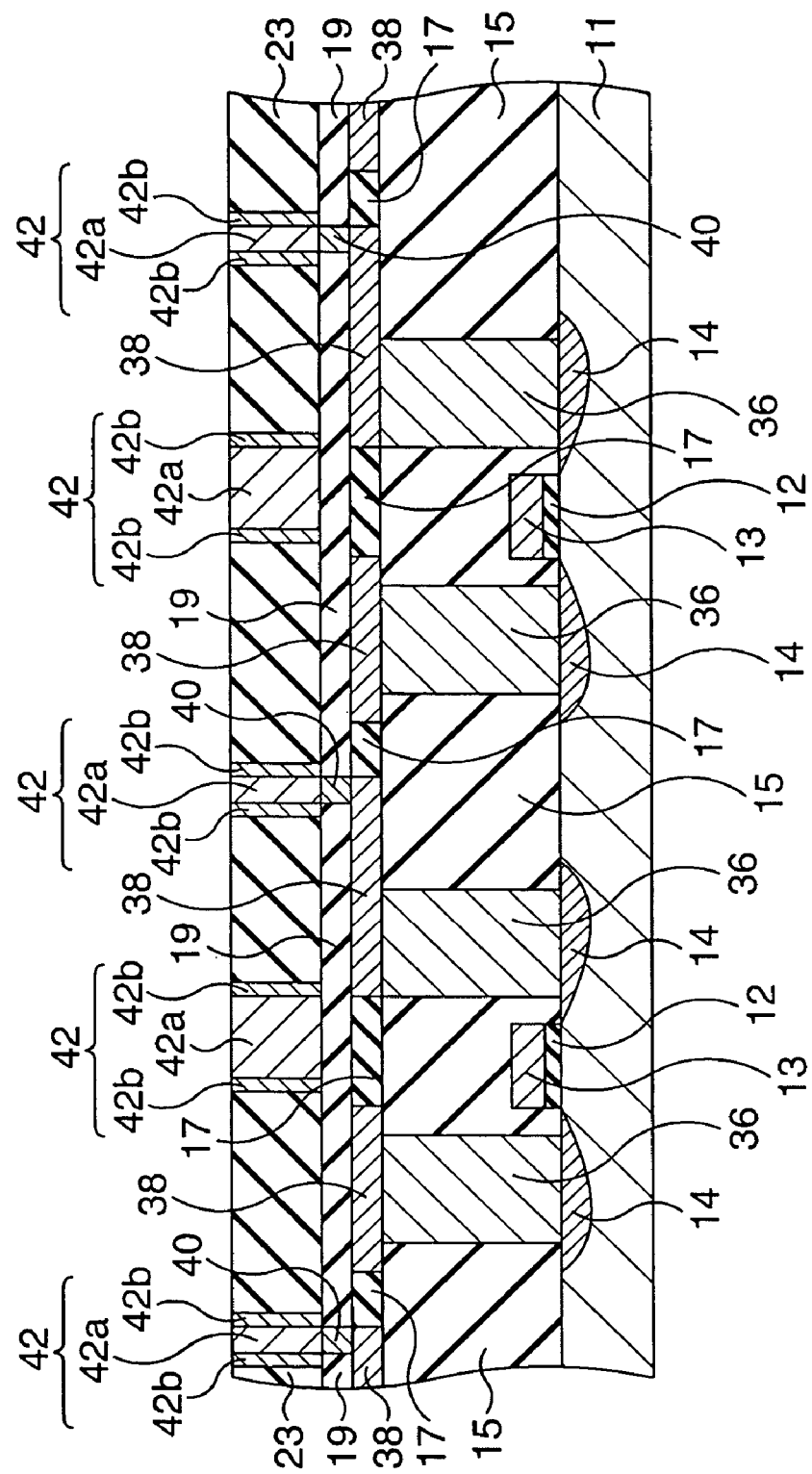

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2004-089338, filed on Mar. 25, 2004, the entire contents of which are incorporated herein by reference.

BACKGROUND OF THE INVENTION

1. Field of the Invention

This invention relates to a semiconductor device suitable for a ferroelectric memory and a method for manufacturing the same.

2. Description of the Related Art

A nonvolatile memory is a semiconductor memory which can store data even when a power supply is turned off. As a kind of the nonvolatile memory, there exists a ferroelectric memory using ferroelectric materials for a capacity insulating film.

The ferroelectric memory utilizes characteristics of two remanent polarizations whose polarities are different from each other, so that data can be stored if the power supply is turns off. The ferroelectric memory endures, in comparison with the other nonvolatile memories, a large number of write/erase cycles giving an indication of nonvolatility, about $10^{10}$ times to $10^{12}$ times. Write/erase speed thereof is also high, on the order of several dozen nanoseconds.

In the ferroelectric memory, a ferroelectric material can be polarized in two opposite directions. If being polarized in one direction is stored as information of "1", and being polarized in the other direction is stored as information of "0", the stored information can be discriminated by distinguishing polarization directions. A polarization direction of a ferroelectric material can be detected by giving the ferroelectric material enough electric potential to reverse the polarization.

In a case that the capacity insulating film is made of a dielectric material, not of the ferroelectric material, the polarization maintains only while a potential difference exists between electrodes. And when the potential difference is removed, the polarization vanishes. Therefore, information is not maintained.

As the ferroelectric materials, lead-system ferroelectric materials and bismuth-system ferroelectric materials can be cited. As the lead-system ferroelectric materials, PZT ($PbZr_xTi_{1-x}O_3$) PLZT ($Pb_yLa_{1-y}Zr_xTi_{1-x}O_3$) and the like can be cited. As the bismuth-system ferroelectric materials, SBT ($SrBi_2Ta_2O_9$), BIT ($Bi_4Ti_3O_{12}$) and the like can be cited.

Because a system LSI using the ferroelectric capacitor may be applied to the equipment in which money information and personal information stored in an IC card or a smart card and the like are handled, extremely high reliability is required. In addition, the system LSI requires a memory retention period for 10 years, write/erase cycles of $10^{15}$ times, and a guarantee for operational stability at the temperature of −45° C. to +125° C.

FIG. 8 is a cross-sectional view showing a part of a conventional ferroelectric memory. An interlayer insulating film 104 is formed over a semiconductor substrate 101, and a ferroelectric capacitor 105 is formed thereon. The ferroelectric capacitor is provided with a lower electrode 106 made of a Pt film, a capacity insulating film 107 made of a PZT film, and an upper electrode 108 made of the Pt film.

On a surface of the semiconductor substrate 101, an element isolation insulating film 102 and a transistor 103 are formed. In the interlayer insulating film 104, a contact plug 109 is embedded. The contact plug 104 reaches to a diffusion layer of the transistor 103. An insulating film 110 covering the ferroelectric capacitor 105 is formed on the interlayer insulating film 104. A contact hole reaching to the upper electrode 108 is formed in the insulating film 110. And an Al wiring 111 which connects the contact plug 109 to the upper electrode 108 is formed.

In the conventional ferroelectric memory thus fabricated, as one of the way to increase a capacity of the ferroelectric capacitor, an enlargement of an area of the capacity insulating film 107 is considered, however, it will lead to the enlargement of a chip area directly. Meanwhile, with a miniaturization technique progresses, there arises a situation that the capacity has to be lowered. Besides, higher electric charge amount of a remanent polarization is also required.

Prior arts are disclosed in Japanese Patent No. 3435966 and Japanese Patent Application Laid-open No. Hei 06-021338.

SUMMARY OF THE INVENTION

An object of the present invention is to provide a semiconductor device capable to obtain high capacity and preferably obtain high amount of a remanent polarization, if a miniaturization technique progresses, and to provide a method for manufacturing the same.

After diligent efforts to seek for solutions to the above problem, the present inventors have come to the following some embodiments of the invention.

A semiconductor device according to the present invention includes a substrate, a transistor formed on the substrate, a pair of electrodes formed above a main plane of the substrate parallel to the main plane, and a ferroelectric film formed between the pair of electrodes. One of the pair of electrodes is connected to the transistor.

In a method for manufacturing a semiconductor device according to the present invention, after an insulating film is formed above a substrate, a pair of electrodes is formed on the insulating film parallel to the main plane of the substrate. Then, a ferroelectric film is formed between the pair of electrodes.

BRIEF DESCRIPTION OF THE DRAWINGS

FIG. 6 is a cross-sectional view showing a preferable example of size of a ferroelectric memory;

FIG. 7A to FIG. 7C are cross-sectional views showing a method for manufacturing a ferroelectric memory (Semiconductor device) according to a second embodiment of the present invention in order of processes.

DETAILED DESCRIPTION OF THE PREFERRED EMBODIMENTS

Figure 1:
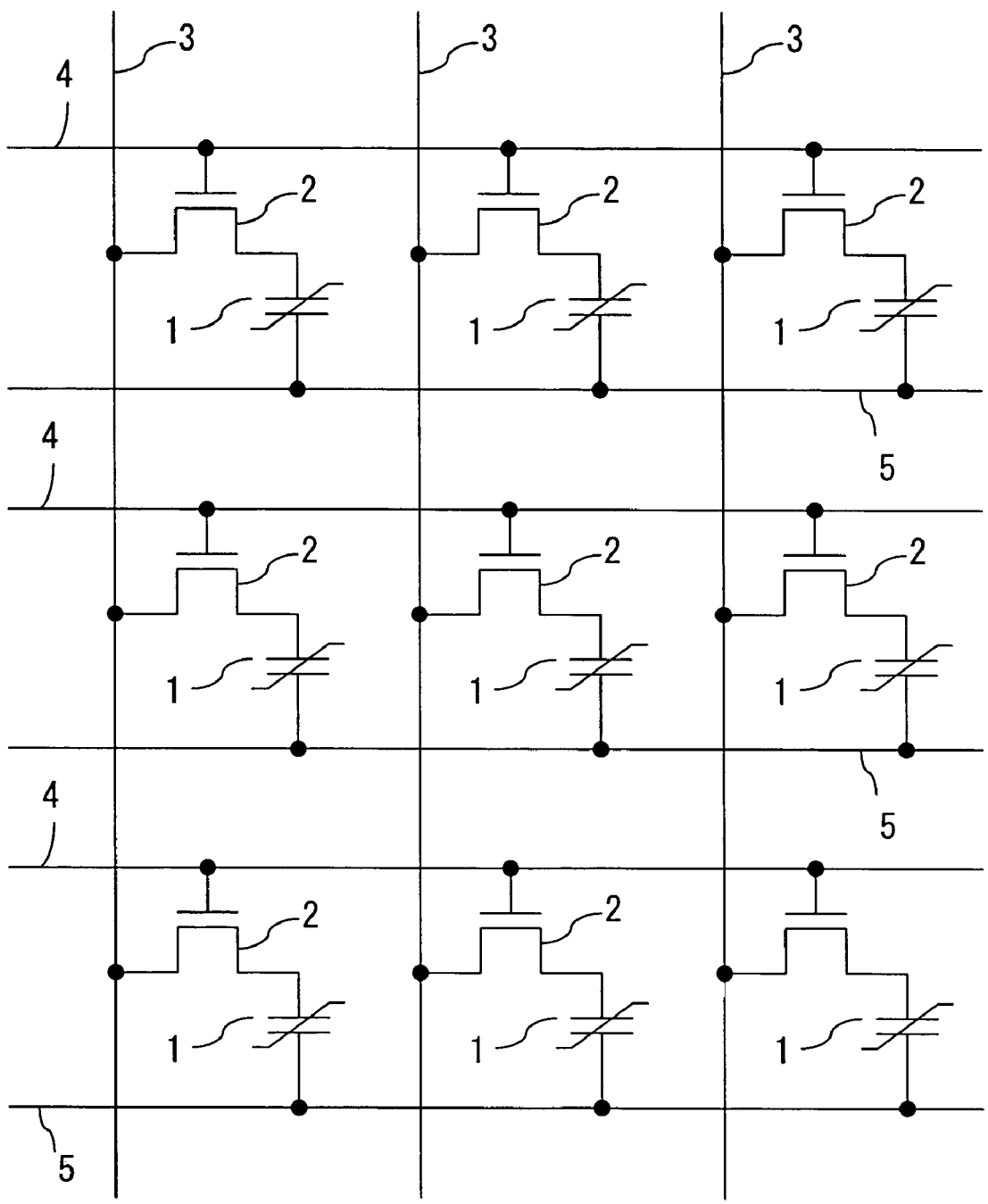
FIG. 1 is a circuit diagram showing a configuration of a memory cell array of a ferroelectric memory (semiconductor device) manufactured by a method according to an embodiment of the present invention.

Hereinafter, embodiments of the present invention will be specifically described with reference to the accompanying drawings. However, for convenience, a cross sectional structure of a ferroelectric memory will be explained here in conjunction with a method for manufacturing the same. FIG. 1 is a circuit diagram showing a configuration of a memory cell array of a ferroelectric memory (semiconductor device) manufactured by a method relating to the embodiments of the present invention.

This memory cell array is provided with a plurality of bit lines 3 extending in one direction and a plurality of word lines 4 and a plurality of plate lines 5 extending in a direction perpendicular to a direction in which the bit lines 3 extend. All plate lines 5 are connected in common with each other and their electric potential are fixed. Further, in a manner to match the grid constituted of these bit lines 3, word lines 4, and plate lines 5, a plurality of memory cells of a ferroelectric memory according to the present embodiment are arranged in an array form. In each memory cell, a ferroelectric capacitor 1 and a MOS transistor 2 are provided.

The gate of the MOS transistor 2 is connected to the word line 4. Further, one source/drain of the MOS transistor 2 is connected to the bit line 3 and the other source/drain is connected to one of electrodes of the ferroelectric capacitor 1. Furthermore, the other electrode of the ferroelectric capacitor 1 is connected to the plate line 5. Note that each of the word lines 4 and plate lines 5 is shared by a plurality of MOS transistors 2 arranged side by side in the same direction as the direction in which the word line 4 and the plate line 5 extend. Similarly, each of the bit lines 3 is shared by a plurality of MOS transistors 2 arranged side by side in the same direction as the direction in which the bit line 3 extends. The direction in which the word line 4 and plate line 5 extend and the direction in which the bit line 3 extends may be called a row direction and a column direction, respectively.

In the memory cell array of the ferroelectric memory thus configured, data is stored in accordance with the polarization state of a ferroelectric film provided in the ferroelectric capacitor 1.

First Embodiment

Next, a first embodiment of the present invention will be described. FIG. 2A to FIG. 2G are cross-sectional views showing a method for manufacturing a ferroelectric memory (semiconductor device) according to the first embodiment of the present invention in the order of steps.

In this embodiment, first, a MOS transistor including a gate insulating film 12, a gate electrode 13 and a source/drain diffusion layer 14 and the like is formed on a surface of a Si substrate 11. This MOS transistor corresponds to the MOS transistor 2 in FIG. 1. Note that the surface of the Si substrate 11 is a (001) plane. Further, after or before the MOS transistor is formed, an element isolation insulating film (not shown) is formed on the surface of the Si substrate 11.

Next, an interlayer insulating film 15 is formed on the whole surface by an epitaxial growth method. As the interlayer insulating film 15, a film made of material whereby an orientation of the Si substrate 11 can be taken on, for example, a zirconium oxide film is formed. Subsequently, in the interlayer insulating film 15, a contact hole reaching to the source/drain diffusion layer 14 is formed, and a W-plug 16 is formed therein.

Figure 2A:
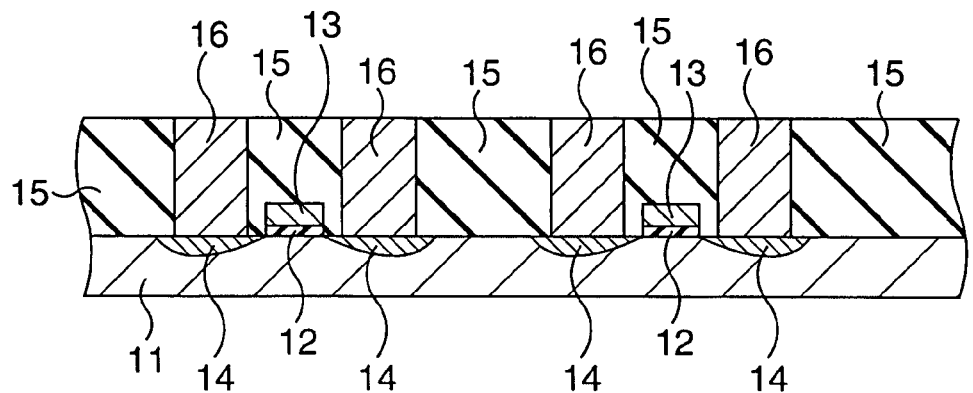
FIG. 2A to FIG. 2G are cross-sectional views showing a method for manufacturing a ferroelectric memory (semiconductor device) according to a first embodiment of the present invention in order of processes.
Figure 2B:
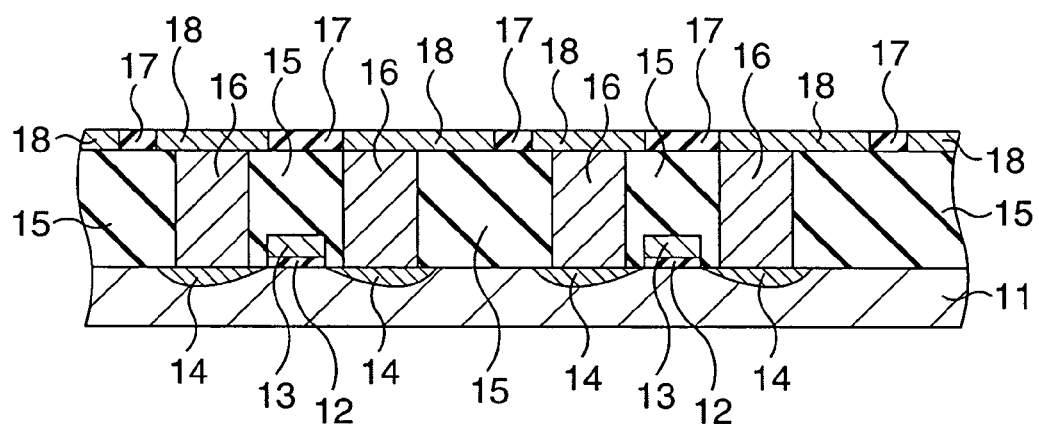

After that, as shown in FIG. 2B, an insulating film 17 is formed on the whole surface. As the insulating film 17, a film made of material whereby the orientation of the interlayer insulating film 15 can be taken on, for example, a zirconium oxide film is formed. Subsequently, by patterning the insulating layer 17, an opening for lead-out wiring is formed in the insulating film 17. Then, a Pt film 18 is embedded in the opening.

Figure 2C:
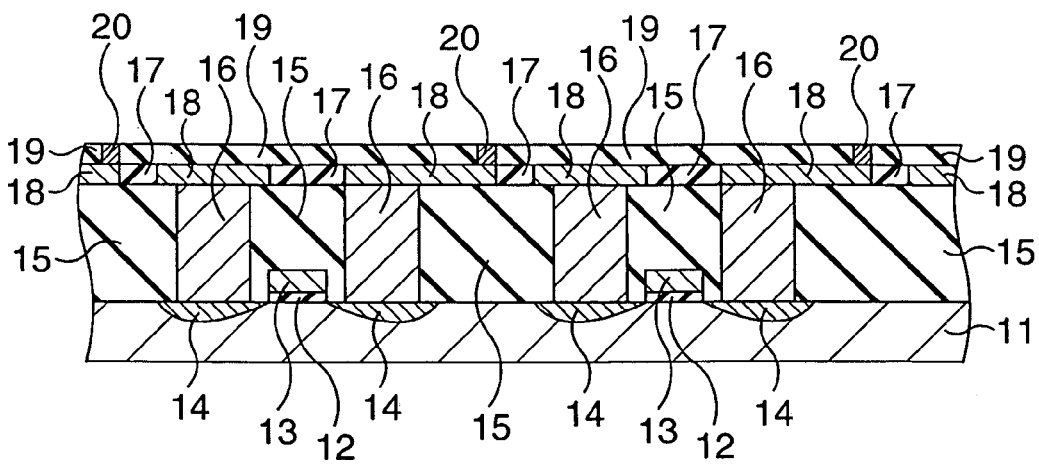

Furthermore, as shown in FIG. 2C, an insulating film 19 is formed on the whole surface. As the insulating film 19, a film made of material whereby the orientation of the insulating film 17 can be taken on, for example, a zirconium oxide film is formed. Subsequently, by patterning the insulating film 19, an opening for the lead-out wiring is formed in the insulating film 19. Then, a Pt film 20 is embedded in the opening. It is preferable that, after the insulating film 19 is formed, the orientation of the insulating film 19 is verified by means of an X-ray diffraction or the like.

Figure 2D:
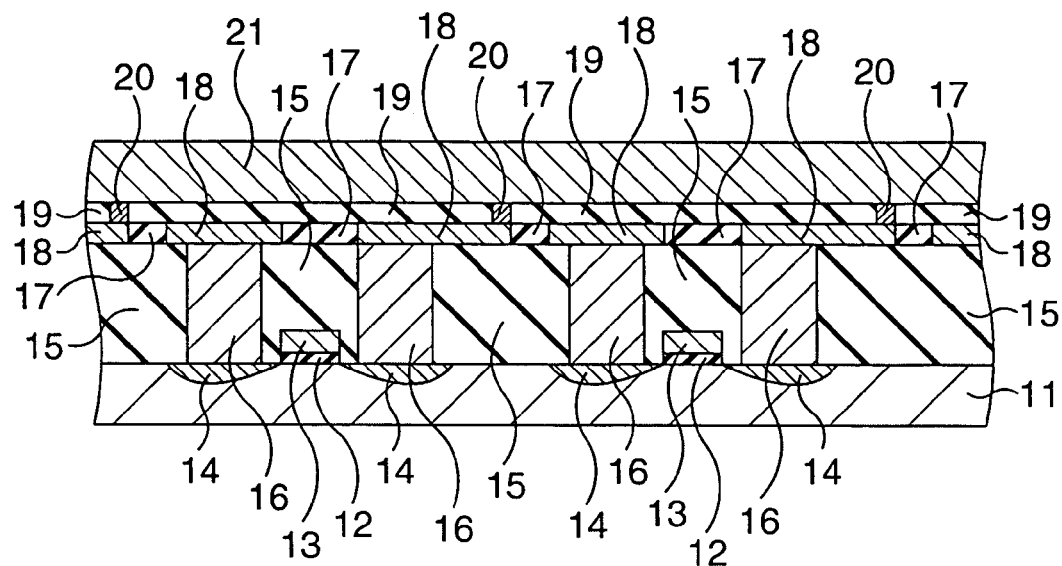

Next, as shown in FIG. 2D, a single-crystalline or a polycrystalline Pt film 21 is formed on the whole surface by the epitaxial growth method. At this time, the Pt film 21 takes on the orientation of insulating film 19, so that the surface of Pt film 21 becomes the (001) plane. Or the surface of the Pt film 21 can be a (111) plane by a self-orientation of Pt.

Figure 2E:
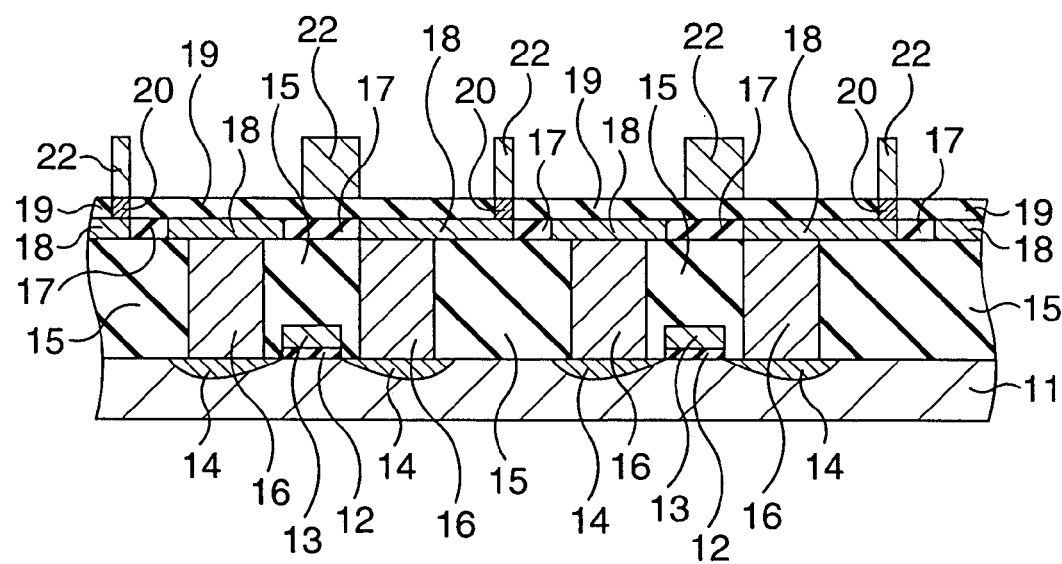

Subsequently, as shown in FIG. 2E, by patterning the Pt film 21, an opening is formed in the Pt film 21 and an electrodes 22 are formed. At this time, a virtual straight line which links between the adjacent electrodes 22 to each other is made to be parallel to a [110] direction of the insulating film 19.

Figure 2F:
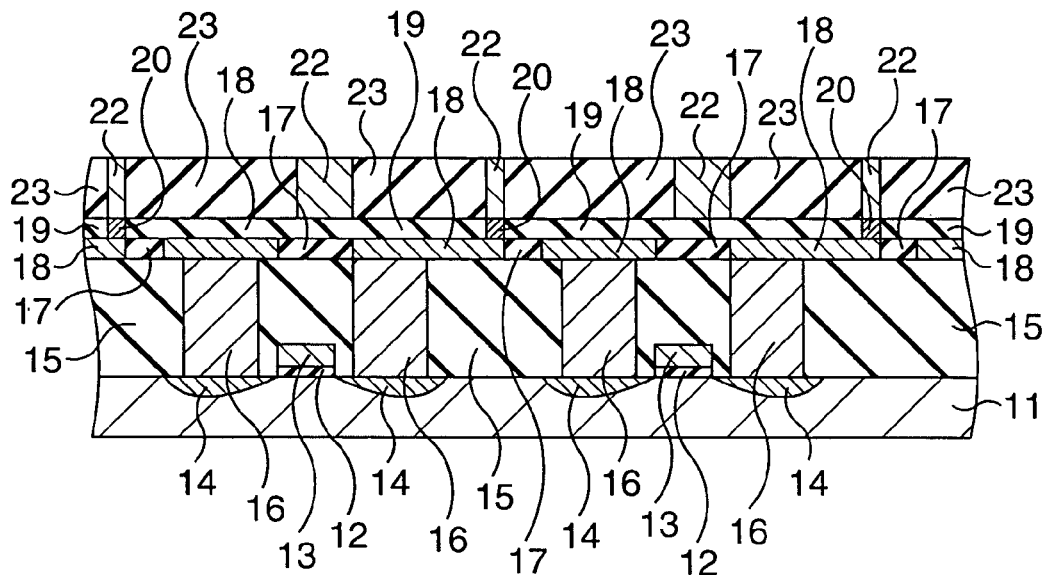

After that, as shown in FIG. 2F, a PZT film 23 is formed between the electrodes 22. At this time, the PZT film 23 is affected by the orientation of the insulating film 19, inside a plane parallel to the surface of the Si substrate 11, a [100] direction of the PZT film 23 becomes parallel to the [110] direction of the insulating film 19. Namely, the [100] direction of the PZT film 23 becomes parallel to the virtual straight line which links between the adjacent electrodes 22 to each other. Two electrodes 22 and the PZT film 23 constitute a ferroelectric capacitor. The ferroelectric capacitor corresponds to the ferroelectric capacitor 1 in FIG. 1.

Figure 2G:
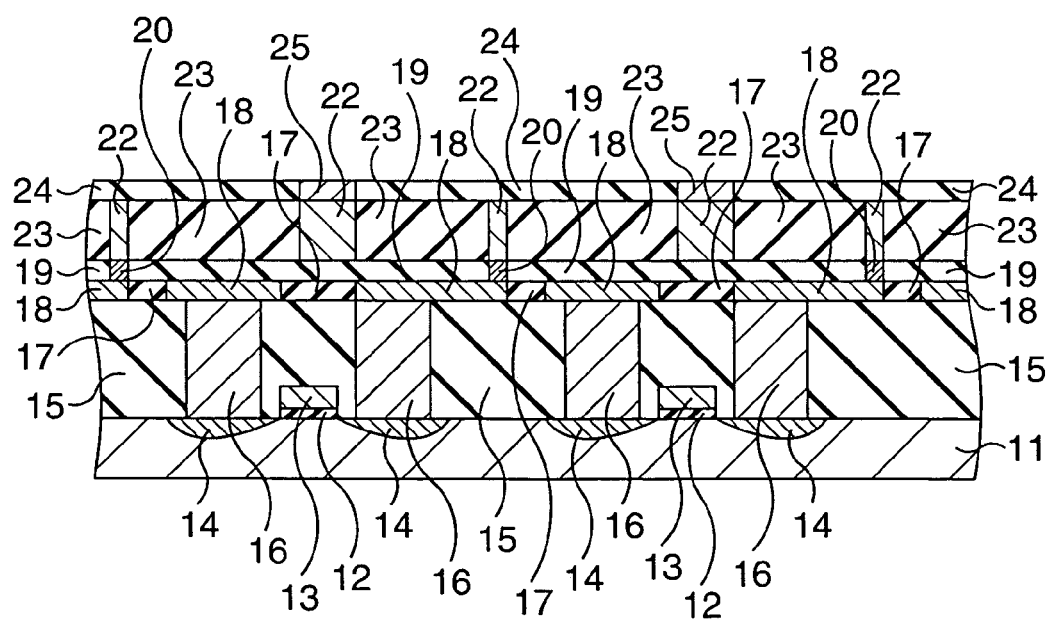

Subsequently, as shown in FIG. 2G, an insulating film 24 and a plate line 25 are formed. Then, wiring and so on further in an upper layer are formed to complete the ferroelectric memory. Note that the gate electrode 13 corresponds to the word line 4 in FIG. 1, and one of the source/drain diffusion layers 14 not connected to the electrode 22 is connected to the bit line 3 in FIG. 1.

In the ferroelectric memory according the first embodiment thus fabricated, the direction in which an electric field applied between the two electrodes 22 and the [100] direction of the PZT film 23 (direction of a polarization axis) are parallel to each other. Therefore, high polarization amount can be obtained. Besides, the two electrodes 22 constituting the ferroelectric capacitor are arranged side by side in a direction parallel to the surface of the Si substrate 11, not in a film thickness direction. Therefore, an area of ferroelectric capacitor in plane view can be smaller than the area of a conventional ferroelectric capacitor.

Conventionally, a ferroelectric film of a ferroelectric capacitor has been formed by a sputtering method, a sol-gel method or the like, and its electric charge amount of remanent polarization is about 20 $\mu C/cm^2$ to about 25 $\mu C/cm^2$. Whereas, in this embodiment, about 30 $\mu C/cm^2$ of the electric charge amount of remanent polarization can be obtained.

Figure 3:
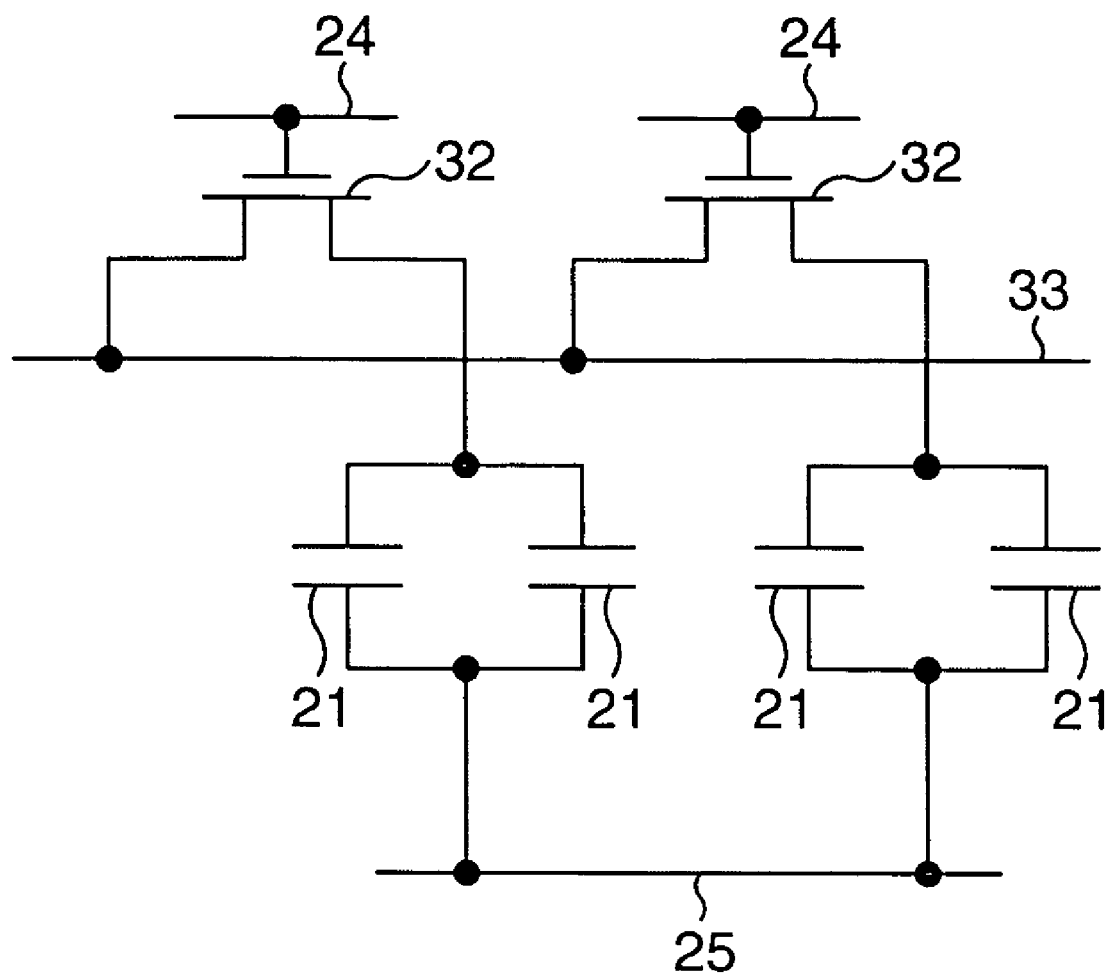
FIG. 3 is an equivalent circuit diagram of a configuration the ferroelectric memory (semiconductor device) manufactured by a method according to the first embodiment of the present invention.

An equivalent circuit diagram of the ferroelectric memory thus fabricated is shown in FIG. 3. Two ferroelectric capacitors 21 correspond to one ferroelectric capacitor 1. A MOS transistor 32 corresponds to the MOS transistor 2. A bit line 33 corresponds to the bit line 3, a word line 24 corresponds to the word line 4, and a plate 25 corresponds to the plate line 5. Accordingly, in this embodiment, the two ferroelectric capacitors 21 are connected to the one MOS transistor 32, so that high capacity as compared with the conventional art can be obtained.

Figure 4A:
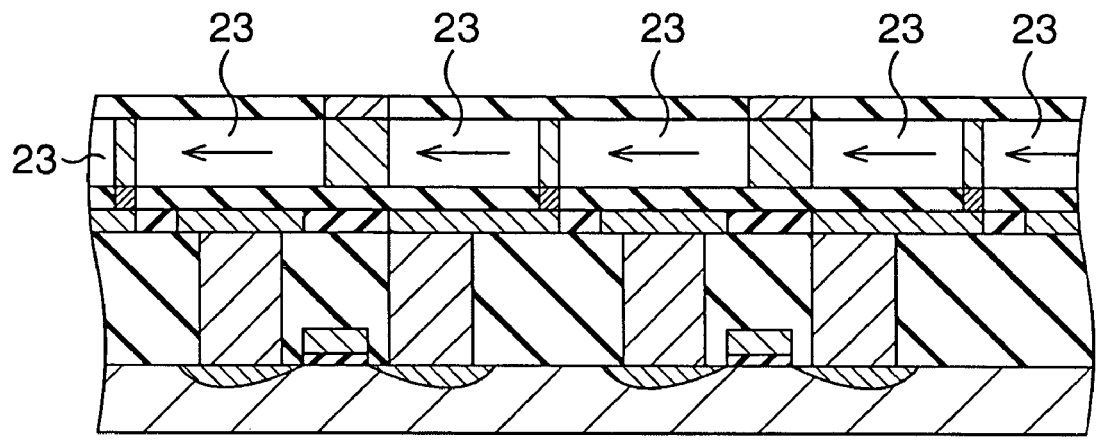
FIG. 4A and FIG. 4B are view showing an initial condition of a ferroelectric capacitor.
Figure 4B:
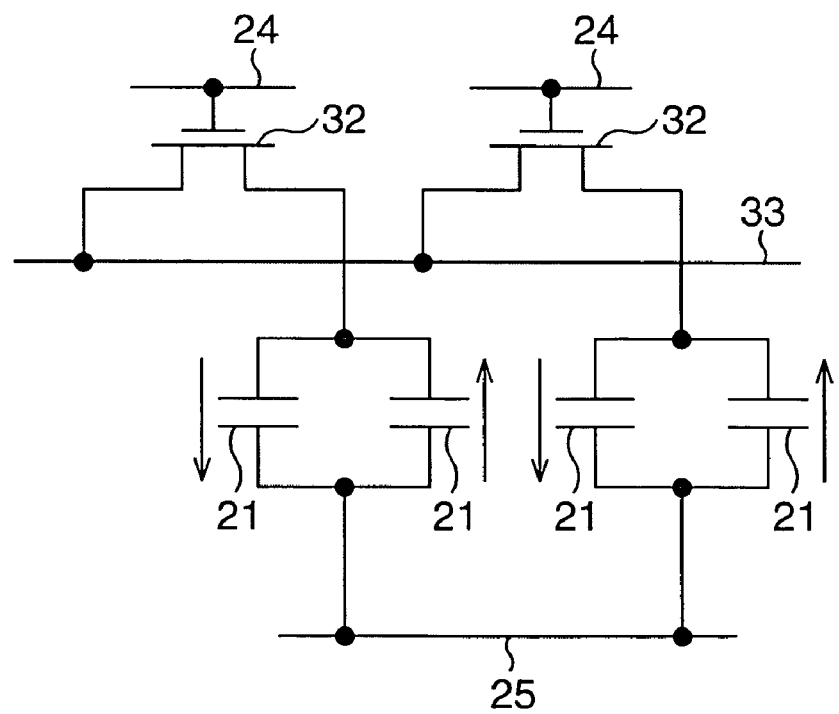
Figure 5A:
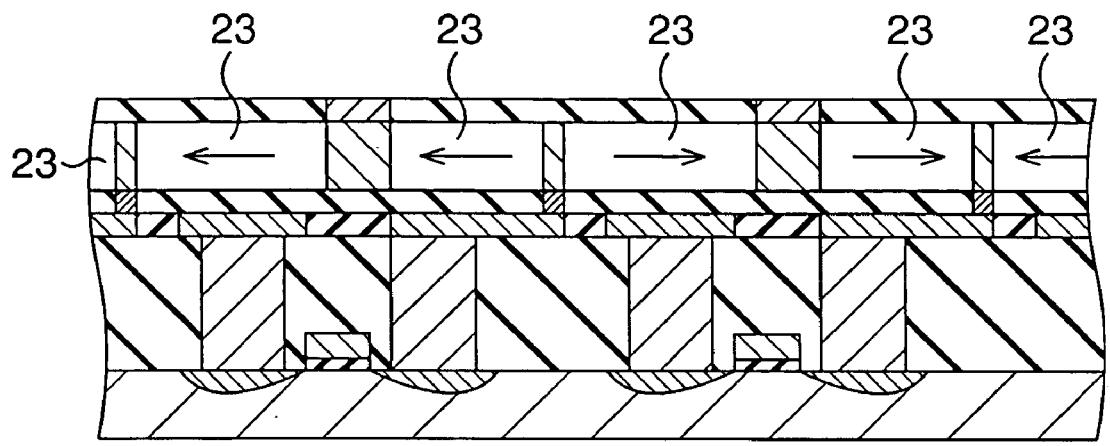
FIG. 5A and FIG. 5B are views showing a condition in which an electric field is applied to the ferroelectric capacitor.
Figure 5B:
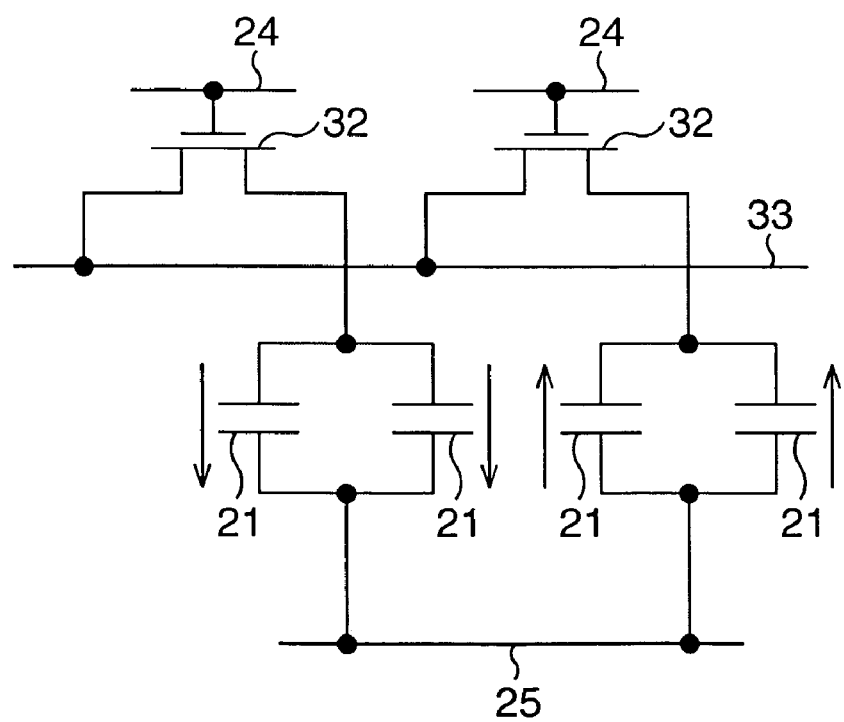

The operation of the ferroelectric capacitor according to the first embodiment will be described below. FIG. 4A and FIG. 4B are views showing an initial condition of the ferroelectric capacitor, and FIG. 5A and FIG. 5B are views showing a condition in which an electric field is applied to the ferroelectric capacitor.

As shown in FIG. 4A to FIG. 4B, when the electric field is not applied to the ferroelectric capacitor and no remanent polarization exists in such a case just after the fabrication, for example, polarization directions of the two ferroelectric capacitors 21 connected to the one MOS transistor 32 are different from each other.

After voltage is applied to one side of the electrodes 22 of the respective ferroelectric capacitor 21 from the bit line 33 through the MOS transistor 32, the polarization directions of the two ferroelectric capacitors 21 connected to the one MOS transistor 32 are made to be the same respectively in accordance with a voltage value. FIG. 5B shows a condition in which different polarities of voltage are applied to two pairs of the ferroelectric capacitors 21 is shown, with the electric potential of the plate line 25 taken as a reference electric potential.

Such a polarization remains even after the power supply to the whole ferroelectric memory is cut off, as a result, storage of information corresponding to the polarization direction can be maintained.

Note that a direction of a virtual straight line linking the source with the drain of the MOS transistor 32 and a direction of the electric field applied between the two electrodes 22 (the [100] direction of the PZT film 23) are parallel to each other for simplifying the views in FIG. 2A to FIG. 2G, however, they are not always necessary to be parallel.

In a case that higher capacity value is required, it is preferable that a direction perpendicular to the direction in which the electric field is applied to the ferroelectric capacitor may be longer, or higher in height. A preferable example of size is shown in FIG. 6. In short, an interval between a pair of electrodes 22 which constitute a ferroelectric capacitor is preferable to be narrower than a height thereof.

Second Embodiment

Figure 7B:
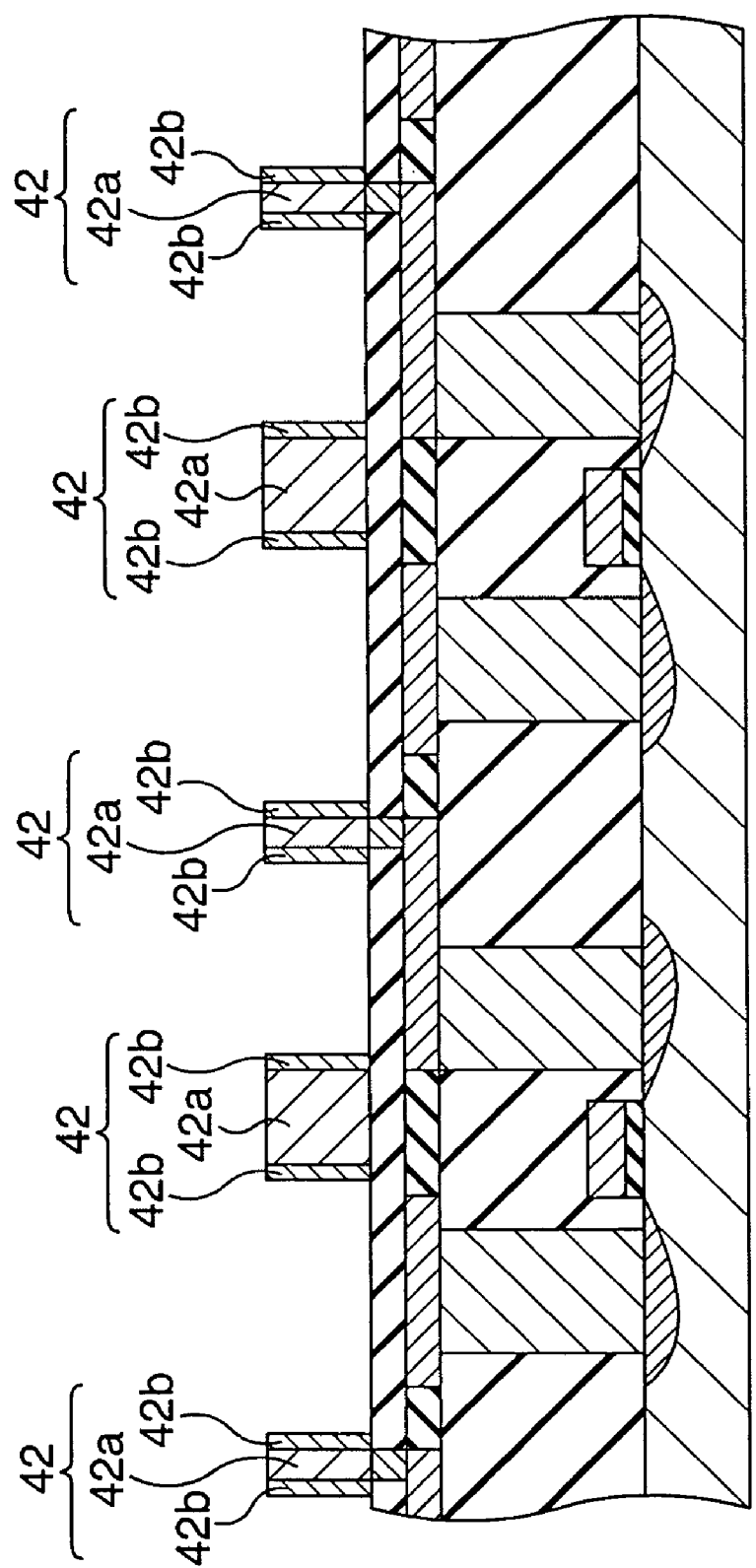
Figure 8:
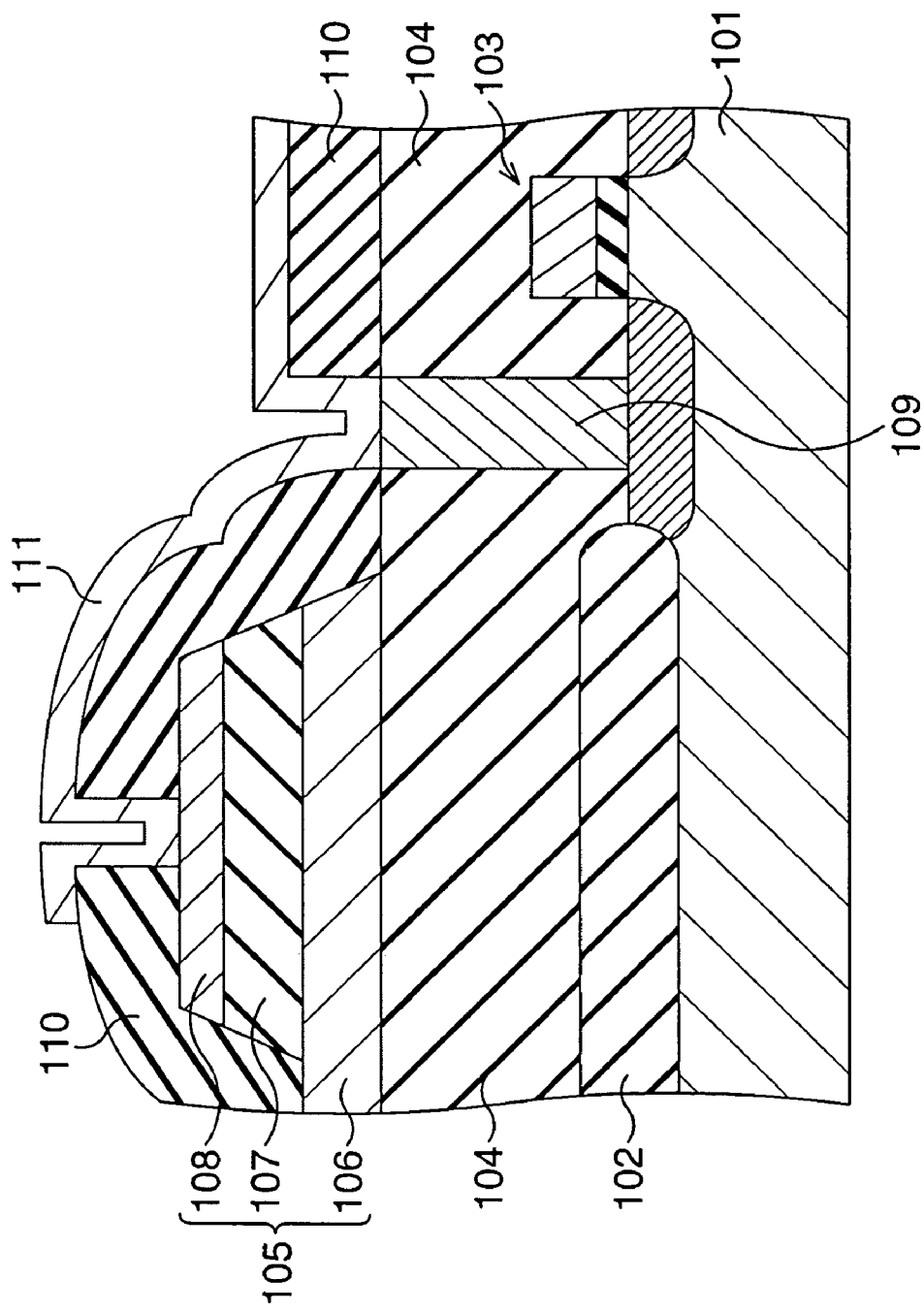
FIG. 8 is a cross-sectional view showing a part of a conventional ferroelectric memory.

Next, a second embodiment of the present invention will be described. FIG. 7A to FIG. 7C are cross-sectional views showing a method for manufacturing a ferroelectric memory (semiconductor device) according to the second embodiment of the present invention in the order of processes.

In this embodiment, different points from the first embodiment are chiefly materials and structure of a contact plug, a lead-routing wiring and an electrode. For example, as shown in FIG. 7A, a TiN-plug 36, instead of the W-plug 16 (first embodiment), is formed as a contact plug. A TiN film 38 and a TiN film 40, instead of the Pt film 18 and the Pt film 20, are formed as the lead-routing wiring. As the TiN plug 36, the TiN film 38 and the TiN film 40, a plug or films made of TiN in single-crystalline state which take on the orientation of the Si substrate 11 (surface: (001) plane) are formed. Therefore, a surface of the TiN film 40 becomes a (001) plane.

After these are formed, in a similar manner to the formation of the Pt film 21 in the first embodiment, a single-crystalline TiN film (not shown) is formed on the whole surface. By patterning this TiN film, a base portion of the electrode 42a made of TiN is formed. A surface of the base portion 42a is also the (001) plane.

Next, as shown in FIG. 7B, a single-crystalline Pt film 42b is formed on a side surface of the base portion 42b by a long-nose sputtering method or a CVD method and the like. A direction perpendicular to a surface of the Pt film 42b (direction parallel to a surface of the Si substrate 11) is a [111] direction because of a self-orientation of the Pt film 42b. At this time, a Pt film (not shown) is formed also on the insulating film 19 and so on, however, portions not used as an electrode are removed selectively. An electrode 42 is composed of the base portion 42a and the Pt film 42b.

Subsequently, as shown in FIG. 7C, in a similar manner to the first embodiment, a PZT film 23 is formed between the electrodes 42. At this time, the PZT film 23 is affected by an orientation of the Pt film 42b. As a result, an electric field direction applied between the two electrodes 42 coincides with the [111] direction of the PZT film 23. Therefore, high polarization amount can be obtained.

After that, a plate line and wiring of an upper layer and the like (not shown) are formed to complete the ferroelectric memory.

According to the second embodiment, in the same way as the first embodiment, an area of the ferroelectric capacitor in plane view can be smaller than the area of a conventional capacitor. Besides, the orientation of a capacity insulating film (the PZT film 23) is controlled by the orientation of the contact plug and the lead-routing wiring, so that high polarization amount can be obtained. Therefore, the interlayer insulating film 15 and the like are not required to take on the orientation of the Si substrate 11, as a result, materials thereof are not limited to zirconium oxide and the like.

In the first and second embodiments, the orientation of a base film of the electrodes and the ferroelectric film composing the ferroelectric capacitor is utilized, however, when the material of the electrodes has a self-orientation such as Pt, the orientation of the ferroelectric film can be controlled, not always utilizing the orientation of the base film. For example, when an amorphous-state Si-oxide film is adopted for an insulating film just under the ferroelectric capacitor and the Pt film is formed thereon, a surface of the Pt film becomes the (111) plane based on the self-orientation of Pt. Then, after confirming the orientation of the Pt film by means of the X-ray diffraction and the like, a pattern of the Pt film may be determined so that a direction in which the electric field is applied and a direction of a polarization axis of the ferroelectric film is closed as much as possible. When the pattern of the Pt film is determined, it is not necessary to assume an etching from the direction perpendicular to the surface of the substrate 11 but the etching from a slanting direction with regard to a direction perpendicular to surface of the Si substrate. For example, the etching of the Pt film with a sidewall thereof being slanted can be assumed, on the ground that the (001) plane slants to the (111) plane by an angle of 54.7 degrees.

Note that the materials for the electrodes are not limited to Pt or TiN, but noble metals such as Ir or Ru, or conductive oxide such as YBCO or LSCO may be used. Further, the materials for the ferroelectric film are not either limited to PZT, but perovskite-ferroelectric materials including Pb such as PLZT, or Bismuth layer-structured ferroelectric materials including Bi such as SBT, BLT or BIT may be used.

According to the present invention, a pair of electrodes composing ferroelectric capacitor is arranged parallel to the main plane of the substrate, so that enlargement of a chip area can be avoided if the area of the ferroelectric film as a capacity insulating film is enlarged. In addition, by controlling an orientation of the ferroelectric film, high electric charge amount of remanent polarization can be obtained with a direction in which an electric field is applied and the direction of a polarization axis being the same.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a substrate;
   a transistor formed on said substrate;
   a pair of electrodes formed above a main plane of said substrate parallel to the main plane, one of said pair of electrodes being connected to said transistor; and
   a ferroelectric film formed between said pair of electrodes;
   wherein a virtual straight line which links between said pair of electrodes and a polarization axis direction of said ferroelectric film are parallel to each other.

2. The semiconductor device according to claim 1, wherein a plurality of combinations of said pair of electrodes and said ferroelectric film, and a plurality of said transistors are provided; and each transistor is connect to two of said ones of said pair of electrodes.

3. The semiconductor device according to claim 1, wherein an interval between said pair of electrodes is narrower than a height thereof.

4. The semiconductor device according to claim 1, wherein said ferroelectric film is composed of perovskite-ferroelectric materials including Pb.

5. The semiconductor device according to claim 1, wherein said ferroelectric film is composed of bismuth-layer structured ferroelectric materials including Bi.

* * * * *